United States Patent
Cooper et al.

(10) Patent No.: US 10,655,645 B2
(45) Date of Patent: May 19, 2020

(54) FAN SYSTEMS INCLUDING BRUSHES AND BRISTLES FOR SELF-CLEANING

(71) Applicant: Lenovo Enterprise Solutions (Singapore) Pte. Ltd., New Tech Park (SG)

(72) Inventors: Ralph Saul Cooper, Raleigh, NC (US); Michael Charles Elles, Raleigh, NC (US); Robert Anthony Fenoglio, Raleigh, NC (US); Paul Klustaitis, Raleigh, NC (US); Luis Quinones Sepulveda, Raleigh, NC (US); Jeffrey B. Williams, Raleigh, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 171 days.

(21) Appl. No.: 15/939,014

(22) Filed: Mar. 28, 2018

(65) Prior Publication Data
US 2019/0301493 A1    Oct. 3, 2019

(51) Int. Cl.
*F04D 29/70* (2006.01)
*F04D 19/00* (2006.01)
(Continued)

(52) U.S. Cl.
CPC ......... *F04D 29/703* (2013.01); *F04D 19/005* (2013.01); *F04D 25/08* (2013.01);
(Continued)

(58) Field of Classification Search
CPC ...... F04D 29/70; F04D 29/701; F04D 29/703; F04D 29/526; G06F 1/20–206; H05K 7/20; H05K 7/20181; H05K 7/20172
See application file for complete search history.

(56) References Cited

U.S. PATENT DOCUMENTS 2,171,248 A * 8/1939 Van Berkel ........... A47L 9/1608
55/392
3,979,194 A * 9/1976 Wiser .................. B01D 46/0065
55/296
(Continued)

FOREIGN PATENT DOCUMENTS

CN    101435430 A  *  5/2009
CN    201977710 U  *  9/2011
(Continued)

OTHER PUBLICATIONS

First Search for CN 108014568, dated Oct. 18, 2019 (Year: 2019).*

*Primary Examiner* — Moshe Wilensky
*Assistant Examiner* — Topaz L. Elliott
(74) *Attorney, Agent, or Firm* — Olive Law Group, PLLC (57) ABSTRACT

A fan system for improved external case fan design with self-cleaning bristles, the fan system includes a housing a housing defining an opening and an interior space that extends along an axis, a plurality of fan blades positioned within the interior space and configured to rotate about the axis, and bristles positioned proximate to the opening of the housing. The fan system also includes one or more brushes configured to rotate about the axis and to be moved to a position to engage the bristles for cleaning and a mechanism configured to move the brushes to the position for engaging the bristles.

18 Claims, 5 Drawing Sheets

(51) Int. Cl.
  *F04D 29/52* (2006.01)
  *F04D 25/08* (2006.01)
  *H05K 7/20* (2006.01)
  *G06F 1/20* (2006.01)
(52) U.S. Cl.
  CPC ............ *F04D 29/526* (2013.01); *G06F 1/20* (2013.01); *H05K 7/20172* (2013.01); *H05K 7/20181* (2013.01)

(56) References Cited

U.S. PATENT DOCUMENTS

| | | | | |
|---|---|---|---|---|
| 4,235,293 | A * | 11/1980 | Ellis | A01D 33/08 171/17 |
| 4,398,508 | A * | 8/1983 | Moon | F01D 11/127 123/41.49 |
| 5,297,395 | A * | 3/1994 | Ozu | F04D 17/04 62/174 |
| 6,041,469 | A * | 3/2000 | Horibe | B01D 46/24 15/301 |
| 6,290,456 | B1 * | 9/2001 | Fichter | F04D 29/162 415/119 |
| 6,508,624 | B2 * | 1/2003 | Nadeau | F01D 5/225 415/173.3 |
| 6,928,692 | B2 * | 8/2005 | Oh | A47L 9/1666 15/352 |
| 8,721,779 | B2 * | 5/2014 | Jeong | F24F 1/0007 96/414 |
| 9,625,223 | B2 * | 4/2017 | Gauthier | F01P 11/06 |

FOREIGN PATENT DOCUMENTS

| | | | | |
|---|---|---|---|---|
| CN | 204664011 U | * | 9/2015 | |
| CN | 107368163 A | * | 11/2017 | |
| CN | 107665035 A | * | 2/2018 | |
| CN | 207053012 U | * | 2/2018 | ............... A47L 9/20 |
| CN | 108014568 A | * | 5/2018 | |
| CN | 105068626 B | * | 9/2018 | |
| GB | 682137 A | * | 11/1952 | ............... A47L 9/20 |
| JP | 59203622 A | * | 11/1984 | |

* cited by examiner

FAN SYSTEMS INCLUDING BRUSHES AND BRISTLES FOR SELF-CLEANING

TECHNICAL FIELD

The presently disclosed subject matter relates to fans. More particularly, the presently disclosed subject matter relates to fan systems including brushes and bristles for self-cleaning.

BACKGROUND

Current external computer case fans are used to actively cool computer components while the computer system is operating. Without external case fans, integrated circuits can become overheated during use, which in turn can lead to system failure and permanent damage to the central processing unit (CPU) and other important computer circuitry.

During use, externally facing case fans can become clogged with dust, lint, and other debris that can adversely affect cooling. For instance, blades of the fan can become saturated with dust and debris which significantly reduce the efficiency and operation capacity of the external case fan. When a case fan becomes ineffective due to becoming clogged, it is imperative to immediately clean or replace the fan. However, the process of cleaning and replacing an externally facing case is tedious and can require significant down-time to the computer system while the fan is being cleaned or replaced.

In view of the foregoing, improved solutions are needed to eliminate or reduce the dust and other debris that can accumulate on fan components.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed herein are systems for improved external case fan design by the use of self-cleaning bristles. According to an aspect of the present disclosure, a fan system includes a housing defining an opening and an interior space that extends along an axis, a plurality of fan blades positioned within the interior space and configured to rotate about the axis, and bristles positioned proximate to the opening of the housing. The fan also includes one or more brushes configured to rotate about the axis and to be moved to a position to engage the bristles for cleaning and a mechanism configured to move the brushes to the position for engaging the bristles. According to another aspect of the present disclosure, the fan system comprises a housing including an air conduit that defines an opening and an interior space that extends along an axis, a plurality of fan blades positioned within the interior space and configured to rotate about the axis, bristles positioned proximate to the opening of the air conduit, and one or more brushes configured to rotate about the axis and to be moved to a position to engage the bristles for cleaning. The fan system also includes a first mechanism configured to move the brushes to the position for engaging the bristles and a second mechanism configured to rotate the air conduit about the axis such that the bristles move across the brushes for dislodging debris from the bristles.

BRIEF DESCRIPTION OF THE DRAWINGS

The foregoing summary, as well as the following detailed description of various embodiments, is better understood when read in conjunction with the appended drawings. For the purposes of illustration, there is shown in the drawings example embodiments; however, the presently disclosed subject matter is not limited to the specific methods and instrumentalities disclosed. In the drawings.

DETAILED DESCRIPTION

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies.

As referred to herein, the term "computing device" should be broadly construed. It can include a server, a general purpose computer, or any other such suitable electronic device. It can include items such as network devices, household appliances, audio visual equipment, radio equipment, laptop computers, any device that has a microprocessor or internal clock circuit, any device that generates electromagnetic emissions, or any device susceptible to interference from electromagnetic emissions. An electronic device can include any suitable device that contains computer circuitry or components related to computing devices that may need required cooling during operation. Example components related to computing devices in the case of computing device hardware includes processors, integrated chips (ICs), memory, input/output devices, and buses. An electronic device may be a type of network device such as a router or a network switch. In more general terms, any device with a microprocessor, internal clock circuit, or any other circuit that generates a time varying current will generate electromagnetic waves, so other example devices include items such as common household appliances, cell phones, televisions, audio/video components, computer monitors, peripherals, and radio devices.

Figure 1:
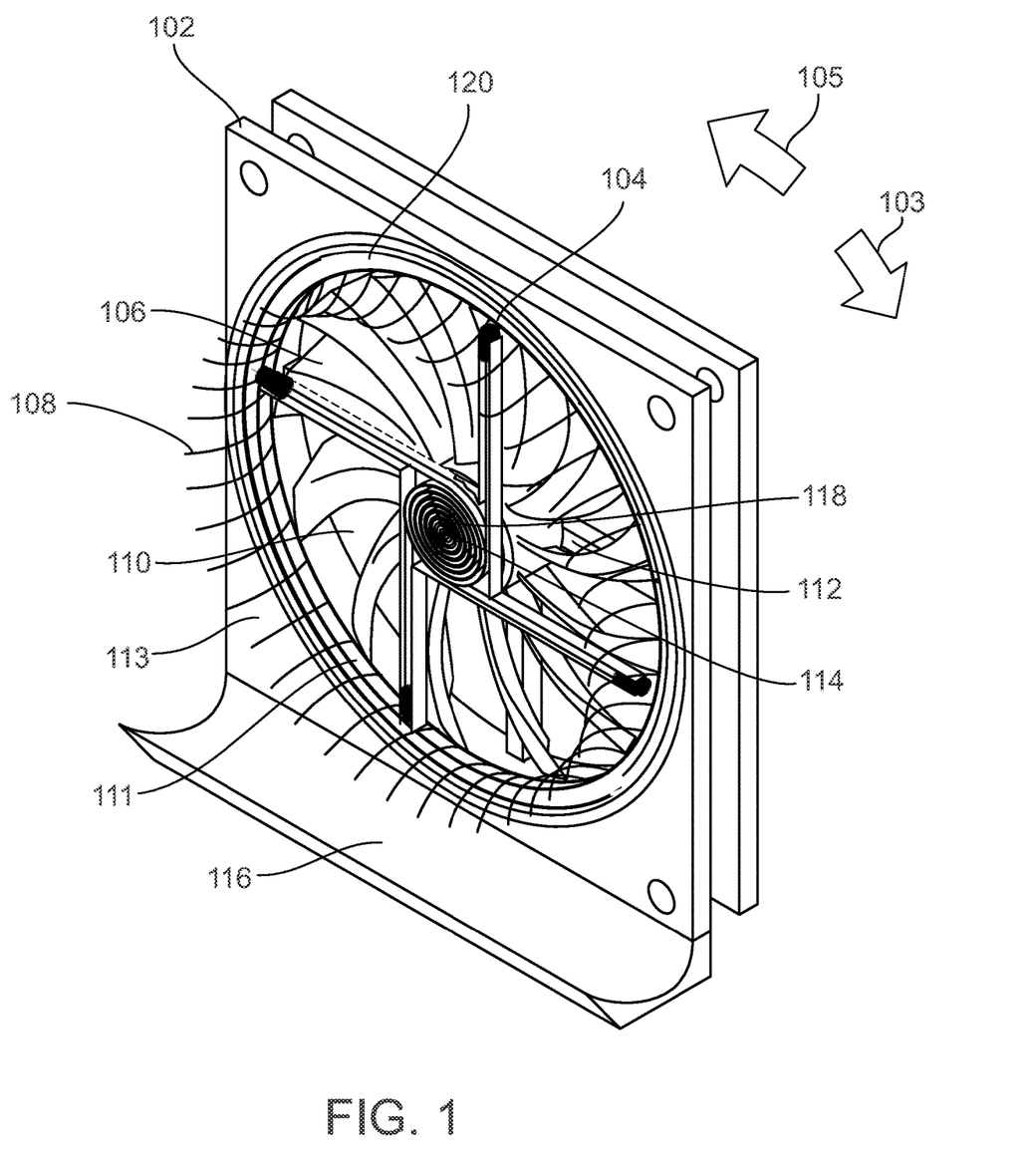
FIG. 1 is a perspective view of the external facing case fan system in accordance with embodiments of the present disclosure.

FIG. 1 is a top perspective view of a fan system in accordance with embodiments of the present disclosure. In this example, the fan system is a case fan system that can be used to cool a computing device, but it should be understood that it may be applied to any suitable fan system for self-cleaning in accordance with embodiments of the present disclosure. Referring to FIG. 1, the fan system includes a housing 102, fan blades 106, bristles 108, an opening 110, a tray 116, an axis 114, a mechanism 112, and brushes 104. The housing 102 may be made of plastic (e.g., polyvinyl chloride or PVC) or any other suitable rigid material or fiber plastic composite. The housing 102 may be suitably shaped to fit within a computing device internal component casing.

Figure 3:
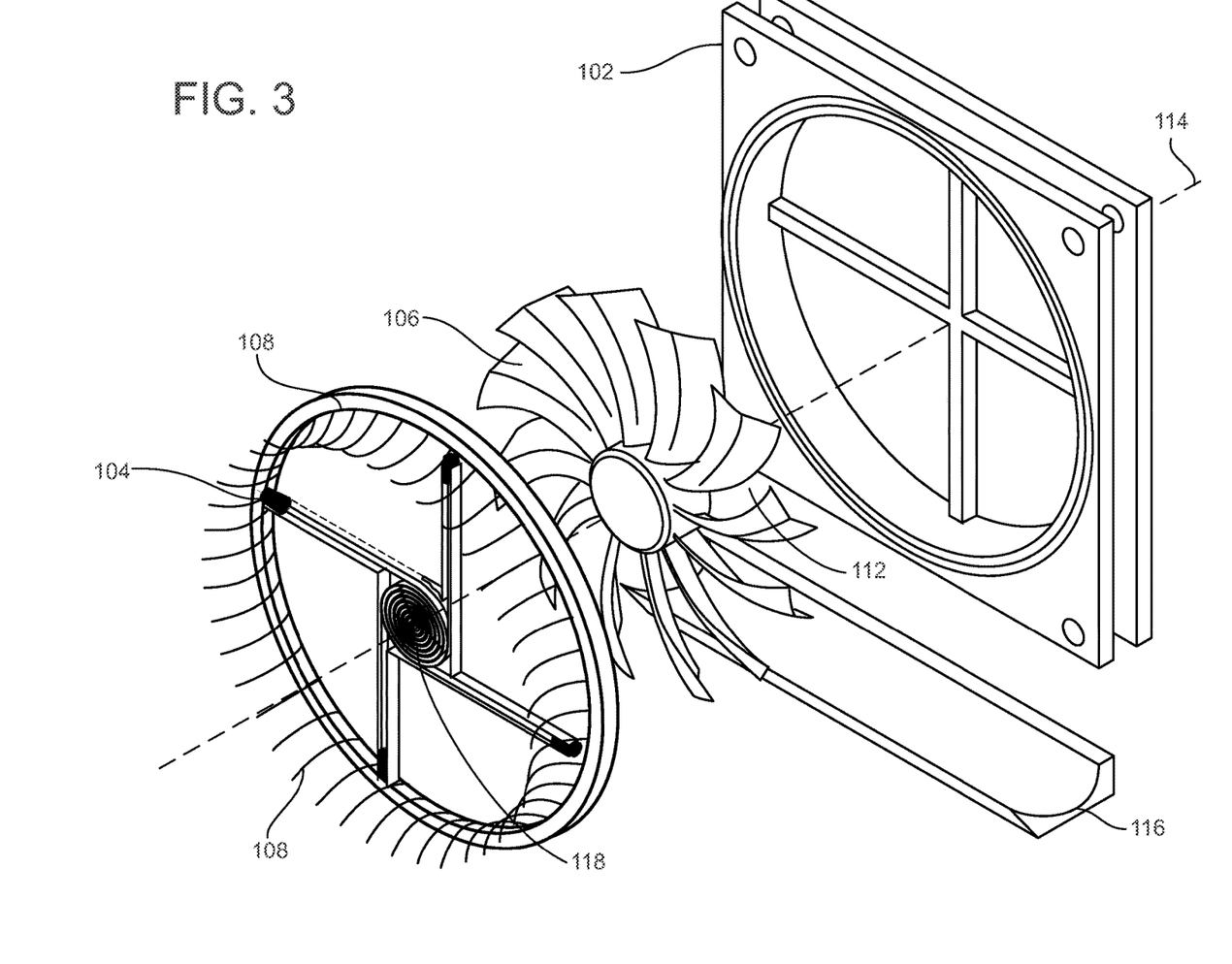
FIG. 3 is a perspective exploded view of the components of the external facing case fan system in accordance with embodiments of the present disclosure.

The housing 102 includes an opening 110 and an interior space 120 that extends along an axis 114 (indicated by broken lines in FIG. 3). The interior space 120 is an air conduit for flow of air between the interior of a computing device (not shown) and outside the computing device. The opening 110 may include an outer edge 111 and an inner edge defined by a surface of the mechanism 112. Fan blades 106 may be positioned around the circumference of the opening 106 or may be positioned proximate to the opening 110. The fan blades 106 may be rotated about the axis 114 in a first direction or a second direction indicated generally by directions arrows 103 and 105, respectively, as described in more detail below. The fan blades 106 may vary in size, dimension, shape, and weight. For illustration purposes, the fan blades 106 are a "fish fin" shape and may be rotated in the first direction or the second direction. Still referring to FIG. 1, bristles 108 are positioned proximate to the opening 110 of the housing 102. The bristles 108 may also extend at least partially in a direction towards the axis 114 or may substantially surround an outer edge of the opening 110. The bristles 108 may engage the brushes 104 for cleaning and removing dust or other types of debris.

In an alternate embodiment, the bristles 108 may be positioned proximate to the opening 110 of the air conduit. Bristles 108 may be made of a rigid plastic or PVC material and may be positioned around the circumference of the housing 102 and may be affixed in a curvature pattern, similar to an eyelash. The bristles 108 may be measured to an optimal length of ⅓ of the housing 102 diameter and may be restricted to 20-60 units per centimeter. Although one row of bristles 108 are illustrated in FIG. 1, multiple rows of bristles 108 may be utilized. Incorporating the bristles 108 in a first row or in a plurality of rows, improves filtration and increases the protective density of air elements. The porosity of the bristles 108 are also decreased.

Also depicted in FIG. 1 are brushes 104. As shown, the brushes 104 may be configured to rotate about the axis 114 and be moved to a position to engage the bristles 108 for cleaning and removing dust and debris. The brushes 104 may also be disengaged for rotation when the fan blades 106 are moving in the first direction 103 or engaged for rotation when the fan blades 106 are moving in the second direction 105. The brushes 104 may include a brush end, which may be defined as the portion of the brush 104 that comes into contact with the bristle 108, that may be attached to the mechanism 112 and configured to move the ends of the brushes 104 in a direction towards the axis 114 when the fan blades 106 rotate about the axis in the first direction 103.

As further shown in FIG. 1, the brushes 104 are attached to the mechanism 112. The mechanism 112 includes a spring coil 118 in which the brushes 104 are attached. The spring coil 118 may be operably connected to the brushes 104 and may be configured to move the ends of the brushes 104 in a direction towards the axis when the fan blades 106 rotate about the axis in the first direction 103. The spring coil 118 may also move the ends of the brushes 104 in a direction away from the axis 114 such that the brushes 104 engage the bristles 108 for cleaning when the fan blades 106 rotate about the axis 114 in a second direction opposing the first direction. In an alternate embodiment, the spring coil 118 may be shaped in a circular coil pattern and may wind up when the fan blades 106 are spinning in a first rotation, which may be a clockwise or counter clock wise direction. As shown in FIG. 1, the axis 114 is the fixed reference point of rotation at the center of the spring coil 118. In operation, when the fan blades 106 are spinning in a first direction, the fan blades 106 may exert enough back pressure onto both the fan blades 106 and bristles 108 that dust and containments may be blown away from the housing 102. The tray 116 may be attached to the housing 102 in a curvature pattern. The tray 116 may also collect the dust, debris, and other containment components blown away from the housing 102.

Figure 2A:
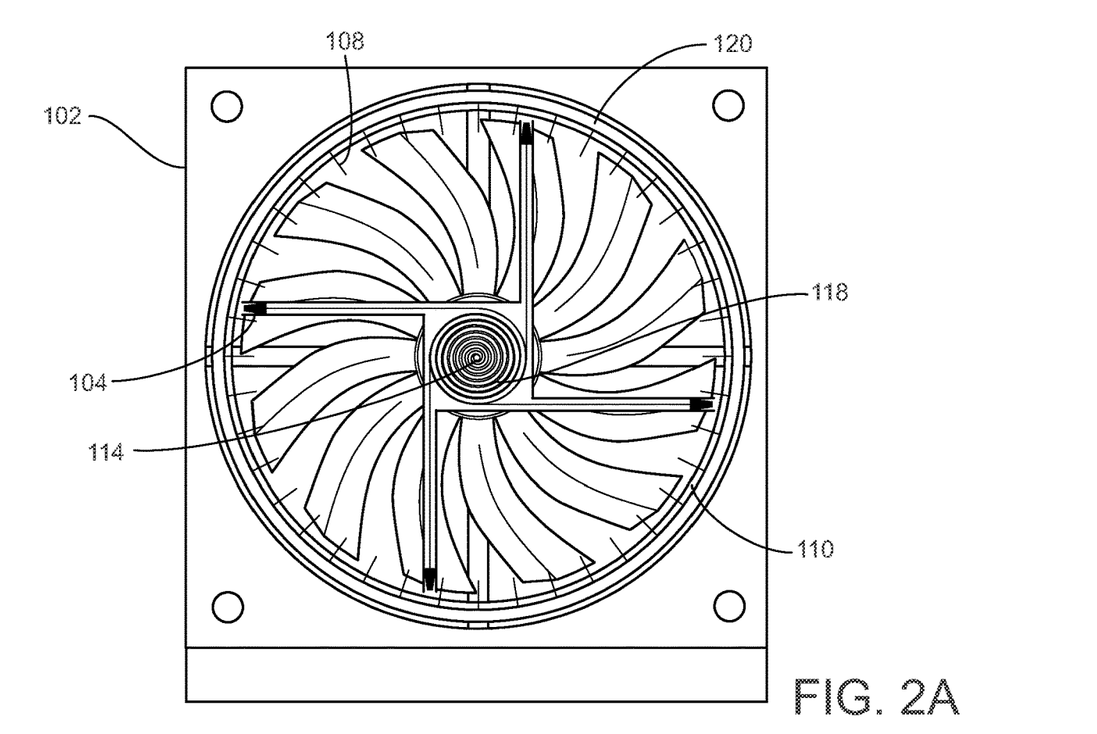
FIGS. 2A and 2B are front views of external facing case fan system in accordance with embodiments of the present disclosure.
Figure 2B:
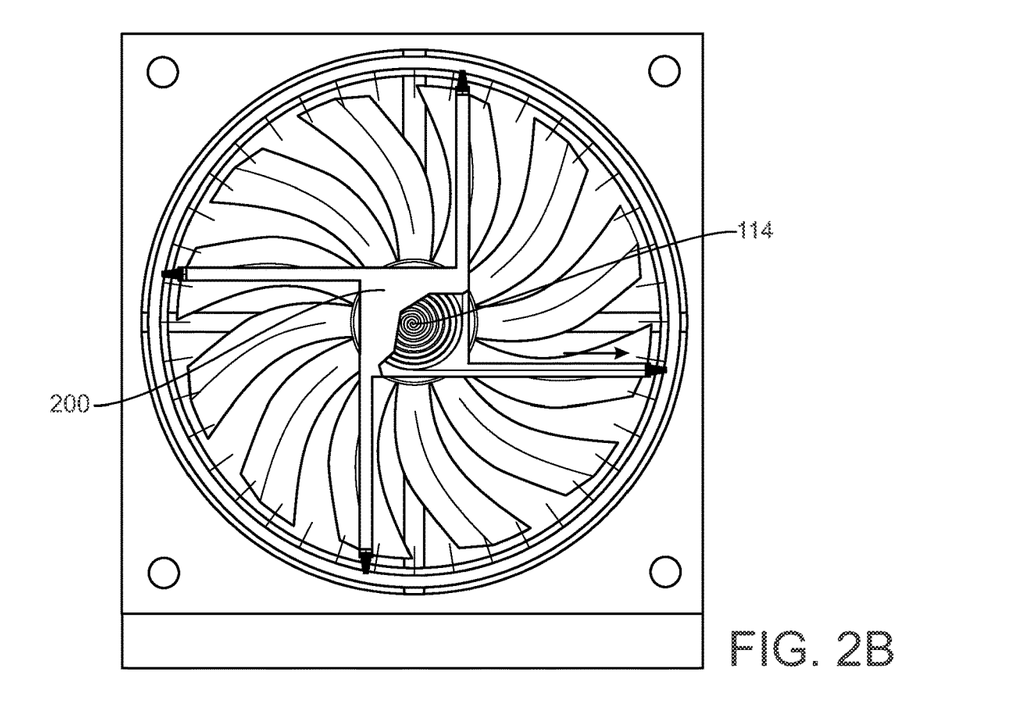

FIGS. 2A and 2B show front views of external facing case fan system in accordance with embodiments of the present disclosure. As shown in FIG. 2A, the arrangement of the housing 102, bristles 108, spring coil 118, interior space 120, opening 110, and brushes 104 are depicted as a frontal view of FIG. 1. In FIG. 2B, a case cover 200 is disclosed. The case cover 200 is a protective casing that covers the spring coil 118 and brushes 104 during operation. FIG. 2B illustrates a cut-away image exposing the internal components behind the case cover 200. Referring now to FIG. 3, which depicts a perspective exploded view of the components of the external facing case fan system in accordance with embodiments of the present disclosure. As shown in greater detail, the housing 102 may be rectangular and/or round in shape while the opening 110 may be an oval shape. Both the interior space 120 and opening 110 are depicted along with the plurality of fan blades 106 which are operably attached to the mechanism 112. The bristles 108 may be positioned proximate circumference of the housing 102, or the interior space 120 as shown and may be in the form of a curvature eyelash shape. The tray 116, the spring coil 118, and brushes 104 are further shown in the exploded view of FIG. 3.

Figure 4:
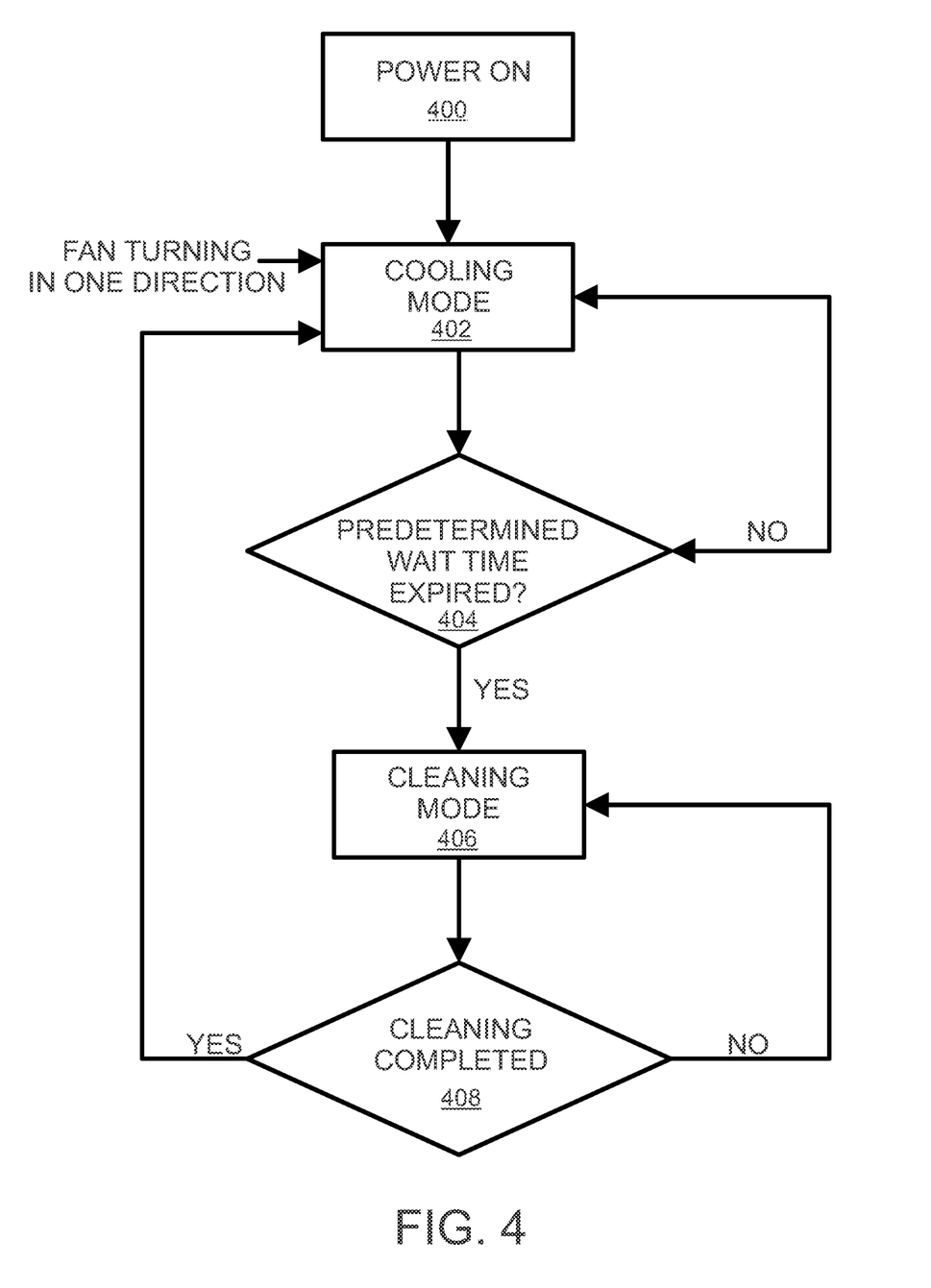
FIG. 4 is a flow chart depicting example operation of the external facing case fan system in accordance with the embodiments of the present disclosure.

Now turning to FIG. 4, the figure depicts a flow chart depicting example operation of the external facing case fan system in accordance with the embodiments of the present disclosure. During operation, the external fan system is first activated at block 400. A cooling mode 402 is initiated in which the fan blades 106 are configured to move in a first direction or in a second direction. The system determines whether a predetermined wait time period has expired 404. If the predetermined wait time period has expired, the system initiates a cleaning mode 406. During the cleaning mode 406, the mechanism 112 may be configured to rotate the fan blades about or around the axis 114 in a first direction and move the brushes 104 to a position where the brushes do not engage the bristles 108 when the fan blades rotate about the axis in the first direction. The mechanism 112 may utilize a motor and clutch (more detailed will be described in FIG. 5 below) for rotating the fan blades in either the first direction or the second direction that opposes the first direction.

The mechanism 112 may also be configured to rotate the fan blades 106 about or around the axis 114 in a second direction that opposes the first direction and move the brushes 104 to the position for engaging the bristles 108 for cleaning when the fan blades 106 rotate about the axis in the second direction. During cleaning mode, the debris, dust, and other containments that may attached to the fan blades 108 or any other component of the fan casing may be collected by the tray 116. If the cleaning is completed 408, the system enters cooling mode 402. If not, the system re-initiates the cleaning mode 406.

Figure 5:
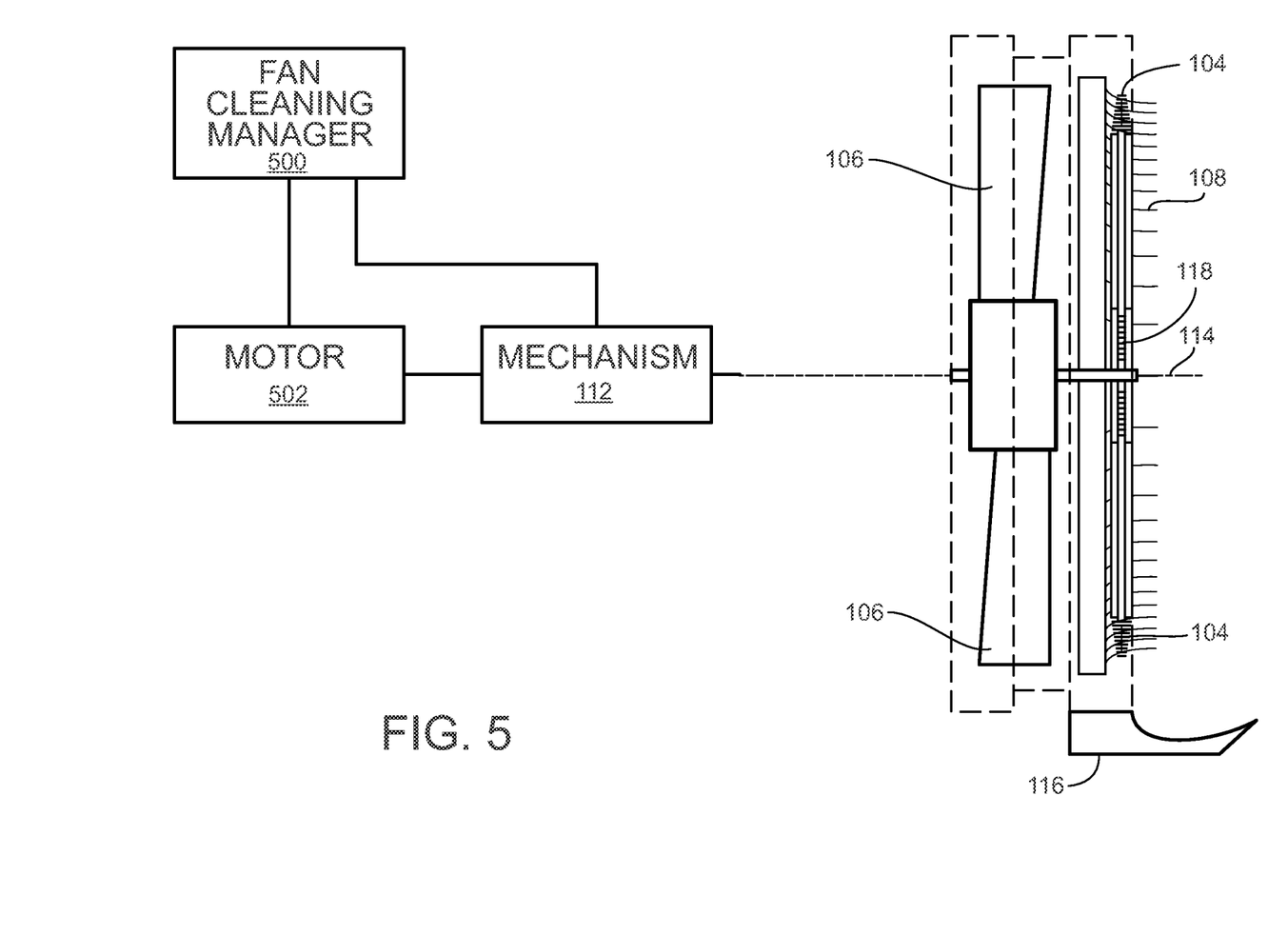
FIG. 5 is a cross-sectional side view and diagram of an example mechanism of the external facing case fan system in accordance with embodiments of the present disclosure.

Now turning to FIG. 5, the figure depicts a cross-sectional side view and diagram of an example mechanism of the external facing case fan system in accordance with embodiments of the present disclosure. Shown in the right cross-sectional view are the fan blades 106, housing 102, brushes 104, bristles 108, spring coil 118, tray 116, and mechanism 112. As shown in the diagram, a fan cleaning manager 500, motor 502, and mechanism 112. As shown in FIG. 5, a fan cleaning manager 500 may contain a processor and memory and be configured to control the mechanism to move the brushes to the position for engaging the bristles. The fan cleaning manager 500 may be implemented by hardware, software, firmware, or combinations thereof. The fan cleaning manager 500 is a broad term used to denote an element that interacts with the motor 502 and other components of the fan system via the processor and memory 104 to control the mechanism to move the brushes, move ends of the brushes in a direction towards the axis when the fan blades 106 rotate about the axis in the first direction, control the spring coil 118 to move the ends of the brushes 104 in a direction away from the axis such that the brushes 104 engage the bristles 108 for cleaning when the fan blades 106 rotate about the axis in a second direction opposing the first direction. In one example, the fan cleaning manager 500 can be a real-time computing chip such as a microcontroller or a field-programmable gate array (FPGA) that collects the raw data from mechanism 118. The motor 502 may be a motor used in the art of computer component cooling devices. The mechanism 112 may also contain a clutch (not shown) in which the clutch may be configured to cause the motor 502 to disengage the brushes 104 rotation when moving the fan blades 106 in the first direction and engage the brushes 104 for rotation when moving the fan blades 106 in the second direction. In an alternate embodiment, the system may include a second mechanism configured to rotate an air conduit (not shown) about the axis such that the bristles move across the brushes for dislodging debris from the bristles.

Aspects of the present subject matter are described herein with reference to flowchart illustrations and/or block diagrams of methods, apparatus (systems), and computer program products according to embodiments of the subject matter. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A fan system comprising:
    a housing defining an opening and an interior space that extends along an axis;
    a plurality of fan blades positioned within the interior space and configured to rotate about the axis;
    bristles positioned proximate to the opening of the housing;
    one or more brushes configured to rotate about the axis and to be moved to a position to engage the bristles for cleaning; and
    a mechanism that moves the brushes to the position for engaging the bristles, wherein the mechanism comprises a spring coil component that is operably connected to the brushes, and wherein the spring coil component moves ends of the brushes in a direction towards the axis when the fan blades rotate about the axis in a first direction.

2. The fan system of claim 1, wherein the mechanism rotates the fan blades about the axis in a first direction, and
    wherein the mechanism moves the brushes to a position where the brushes do not engage the bristles when the fan blades rotate about the axis in the first direction.

3. The fan system of claim 2, wherein the mechanism moves ends of the brushes in a direction towards the axis when the fan blades rotate about the axis in the first direction.

4. The fan system of claim 2, wherein the mechanism rotates the fan blades about the axis in a second direction that opposes the first direction, and
    wherein the mechanism moves the brushes to the position for engaging the bristles for cleaning when the fan blades rotate about the axis in the second direction.

5. The fan system of claim 4, wherein the mechanism rotates the fan blades about the axis when the fan blades rotate about the axis in the second direction.

6. The fan system of claim 1, further comprising a tray positioned in proximity to the opening for collecting debris cleaned from the bristles.

7. The fan system of claim 1, wherein the spring coil component moves the ends of the brushes in a direction away from the axis such that the brushes engage the bristles for cleaning when the fan blades rotate about the axis in a second direction opposing the first direction.

8. The fan system of claim 1, further comprising a fan cleaning manager that controls the mechanism to move the brushes to the position for engaging the bristles.

9. A fan system comprising:
    a housing defining an opening and an interior space that extends along an axis;
    a plurality of fan blades positioned within the interior space and configured to rotate about the axis;
    bristles positioned proximate to the opening of the housing;
    one or more brushes that rotate about the axis and move to a position that engages the bristles for cleaning; and
    a mechanism that moves the brushes to the position for engaging the bristles,
    wherein the mechanism comprises a motor and a clutch for rotating the fan blades in either a first direction or a second direction that opposes the first direction,
    wherein the clutch causes the motor to:
        disengage the brushes for rotation when moving the fan blades in the first direction; and
        engage the brushes for rotation when moving the fan blades in the second direction.

10. The fan system of claim 9, wherein the bristles substantially surround an outer edge of the opening.

11. The fan system of claim 9, wherein the bristles extend at least partially in a direction towards the axis.

12. A fan system comprising:
a housing including an air conduit that defines an opening and an interior space that extends along an axis;
a plurality of fan blades positioned within the interior space and rotate about the axis;
bristles positioned proximate to the opening of the air conduit;
one or more brushes that rotate about the axis and move to a position to engage the bristles for cleaning;
a first mechanism that moves the brushes to the position for engaging the bristles; and
a second mechanism that rotates the air conduit about the axis such that the bristles move across the brushes for dislodging debris from the bristles.

13. The fan system of claim 12, wherein the first mechanism comprises a motor and a clutch that rotates the fan blades in either a first direction or the second direction that opposes the first direction,
wherein the clutch causes the motor to:
disengage the brushes for rotation when moving the fan blades in the first direction; and
engage the brushes for rotation when moving the fan blades in the second direction.

14. The fan system of claim 12, wherein the first mechanism moves ends of the brushes in a direction towards the axis when the fan blades rotate about the axis in a first direction.

15. The fan system of claim 12, wherein the second mechanism rotates the fan blades about the axis in a second direction that opposes a first direction, and
wherein the second mechanism moves the brushes to the position for engaging the bristles for cleaning when the fan blades rotate about the axis in the second direction.

16. The fan system of claim 12, wherein the first mechanism comprises a spring coil component that is operably connected to the brushes, and wherein the spring coil component moves ends of the brushes in a direction towards the axis when the fan blades rotate about the axis in a first direction.

17. The fan system of claim 16, wherein the spring coil component moves the ends of the brushes in a direction away from the axis such that the brushes engage the bristles for cleaning when the fan blades rotate about the axis in a second direction opposing a first direction.

18. A fan system comprising:
a housing including an air conduit that defines an opening and an interior space that extends along an axis;
a plurality of fan blades positioned within the interior space and rotate about the axis;
bristles positioned proximate to the opening of the air conduit;
one or more brushes that rotate about the axis and move to a position to engage the bristles for cleaning;
a first mechanism that moves the brushes to the position for engaging the bristles; and
a second mechanism that rotates the air conduit about the axis such that the bristles move across the brushes for dislodging debris from the bristles,
wherein the first mechanism rotates the fan blades about the axis in a first direction, and
wherein the first mechanism moves the brushes to a position where the brushes do not engage the bristles when the fan blades rotate about the axis in the first direction.

* * * * *